(12) United States Patent
Liu

(10) Patent No.: US 12,028,995 B2
(45) Date of Patent: Jul. 2, 2024

(54) HINGE STRUCTURE WITH DRIVING ASSEMBLY AND FOLDABLE DISPLAY DEVICE HAVING SAME

(71) Applicant: BEIJING XIAOMI MOBILE SOFTWARE CO., LTD., Beijing (CN)

(72) Inventor: Jianwei Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 104 days.

(21) Appl. No.: 17/681,414

(22) Filed: Feb. 25, 2022

(65) Prior Publication Data
US 2023/0035597 A1     Feb. 2, 2023

(30) Foreign Application Priority Data
Jul. 30, 2021    (CN) .......................... 202110871533.7

(51) Int. Cl.
*H05K 5/02*        (2006.01)
*F16C 11/04*      (2006.01)
*H05K 5/00*        (2006.01)

(52) U.S. Cl.
CPC ............ *H05K 5/0226* (2013.01); *F16C 11/04* (2013.01); *H05K 5/0017* (2013.01)

(58) Field of Classification Search
CPC ..... H05K 5/0226; H05K 5/0017; F16C 11/04; G06F 1/1681
See application file for complete search history.

(56) References Cited

U.S. PATENT DOCUMENTS

| | | | |
|---|---|---|---|
| 7,866,619 B2 * | 1/2011 | Yeo ..................... | B60R 11/0235 248/922 |
| 8,122,970 B2 * | 2/2012 | Palen .................. | A01B 73/046 172/776 |
| 8,199,471 B2 * | 6/2012 | Bemelmans ............. | G09F 9/00 455/462 |
| 9,664,210 B2 * | 5/2017 | Ou ........................... | F16J 3/02 |
| 9,864,412 B2 * | 1/2018 | Park ...................... | G06F 1/1652 |
| 9,924,603 B2 * | 3/2018 | Cope ......................... | G09F 9/33 |
| 10,847,735 B2 * | 11/2020 | Seo ......................... | G09F 9/301 |
| 11,079,797 B1 * | 8/2021 | Remez ............... | H04M 1/0268 |
| 2008/0136297 A1 * | 6/2008 | Huang ................. | G06F 1/1681 312/219 |
| 2013/0170119 A1 * | 7/2013 | Lai ...................... | H05K 5/0226 361/679.01 |

(Continued)

FOREIGN PATENT DOCUMENTS

EP        3675093 A1    7/2020

OTHER PUBLICATIONS

The Extend European Search Report issued in Application No. 22158877.5 dated Aug. 2, 2022,(9p).

*Primary Examiner* — Abhishek M Rathod
*Assistant Examiner* — Douglas R Burtner
(74) *Attorney, Agent, or Firm* — Arch & Lake LLP

(57) ABSTRACT

A hinge structure and a foldable display device are provided. The hinge structure includes a rotating shaft, a driving assembly and a connecting assembly. The driving assembly is connected to the connecting assembly and the rotating shaft, respectively, and is configured to drive the connecting assembly to move relatively to the rotating shaft in at least one of a hydraulic manner or a pneumatic manner under the drive of the rotating shaft when the rotating shaft rotates.

18 Claims, 8 Drawing Sheets

(56) References Cited

U.S. PATENT DOCUMENTS

| | | | | |
|---|---|---|---|---|
| 2013/0170122 A1* | 7/2013 | Lai | ............... | H05K 5/0226 |
| | | | | 361/679.01 |
| 2013/0176672 A1* | 7/2013 | Richard | ............... | G06F 1/181 |
| | | | | 361/679.01 |
| 2014/0099479 A1* | 4/2014 | Krall | ............... | H04M 1/0269 |
| | | | | 428/174 |
| 2015/0366095 A1* | 12/2015 | Junkins | ............... | G06F 1/181 |
| | | | | 312/319.2 |
| 2016/0299539 A1* | 10/2016 | Jang | ............... | G06F 1/1652 |
| 2016/0374228 A1* | 12/2016 | Park | ............... | G09F 9/301 |
| 2019/0270497 A1* | 9/2019 | Leonard | ............... | F16M 11/10 |
| 2020/0201394 A1* | 6/2020 | Choi | ............... | G06F 1/1652 |
| 2020/0212325 A1* | 7/2020 | Seo | ............... | H10K 59/12 |
| 2021/0181808 A1* | 6/2021 | Liao | ............... | G06F 1/1641 |
| 2023/0072005 A1* | 3/2023 | Oh | ............... | G09F 9/301 |

* cited by examiner

HINGE STRUCTURE WITH DRIVING ASSEMBLY AND FOLDABLE DISPLAY DEVICE HAVING SAME

CROSS-REFERENCE TO RELATED APPLICATION

The present application is based upon and claims the priority to Chinese Application No. 202110871533.7, filed on Jul. 30, 2021, the content of which is incorporated herein by reference in its entirety for all purposes.

BACKGROUND

A foldable display device is a display device with a display-screen folding function, and usually includes a hinge structure and a flexible display screen mounted on the hinge structure. The hinge structure may be configured to control folding of the flexible display screen.

SUMMARY

The present disclosure relates to a field of foldable screens, and more particularly, to a hinge structure and a foldable display device.

According to a first aspect of the present disclosure, a hinge structure is provided and includes a rotating shaft, a driving assembly and a connecting assembly. The driving assembly is connected to the connecting assembly and the rotating shaft, respectively. The driving assembly is configured to drive the connecting assembly to move relative to the rotating shaft in at least one of a hydraulic manner or a pneumatic manner under the drive of the rotating shaft when the rotating shaft rotates.

According to another aspect of the present disclosure, a foldable display device is provided and includes a flexible display panel and a hinge structure, and the flexible display panel is arranged on the hinge structure. The hinge structure includes a rotating shaft, a driving assembly and a connecting assembly. The driving assembly is connected to the connecting assembly and the rotating shaft, respectively. The driving assembly is configured to drive the connecting assembly to move relative to the rotating shaft in at least one of a hydraulic manner or a pneumatic manner under the drive of the rotating shaft when the rotating shaft rotates.

It is to be understood that the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure

These drawings and descriptions are not construed to limit the scope of the concept of the present disclosure in any way, but are intended to explain the concept of the present disclosure to those skilled in the related art by referring to specific embodiments.

DETAILED DESCRIPTION

Reference will now be described in detail to examples, which are illustrated in the accompanying drawings. The following description refers to the accompanying drawings in which the same numbers in different drawings represent the same or similar elements unless otherwise represented. The examples described following do not represent all examples consistent with the present disclosure. Instead, they are merely examples of devices and methods consistent with aspects of the disclosure as detailed in the appended claims.

A foldable display device in the related art includes a hinge structure and a flexible display screen mounted on the hinge structure. The hinge structure includes a bracket, an electric driving assembly and two hinge components. The electric driving assembly and the hinge components are mounted on the bracket, and the hinge component has a retractable structure. The electric driving assembly is connected to a control circuit in the foldable display device, and configured to drive the retractable structure of the hinge component to extend and retract under the control of the control circuit, so as to control a bent portion of the flexible display screen during the folding of the flexible display screen, thereby preventing the bent portion from being squeezed or reducing creases at the bent portion.

However, in the above hinge structure, the electric driving assembly needs to be connected with an external control circuit, while the structures of the electric driving assembly and the external control circuit are complex and occupy a large space.

Figure 1:
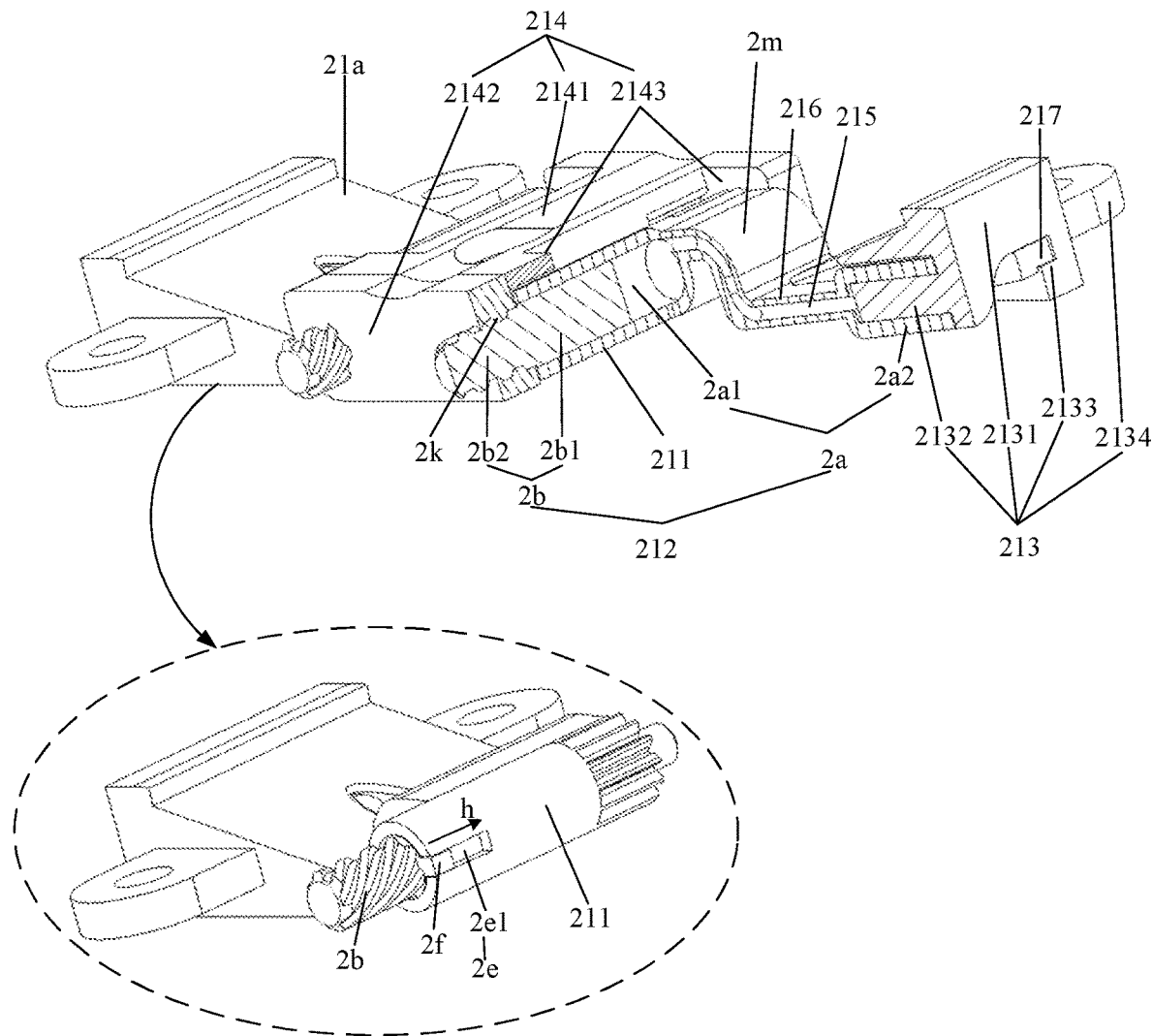
FIG. 1 is a schematic view of a hinge structure according to one or more examples of the present disclosure.

FIG. 1 is a schematic view of a hinge structure according to an illustrative example of the present disclosure. A hinge structure 21 includes a rotating shaft 211, a driving assembly 212 and a connecting assembly 213.

The driving assembly 212 is connected to the connecting assembly 213 and the rotating shaft 211, respectively. The driving assembly 212 is configured to drive the connecting assembly 213 to move away from or close to the rotating shaft 211 in a hydraulic and/or pneumatic manner under the drive of the rotating shaft 211 when the rotating shaft 211 rotates.

To sum up, an illustrative example of the present disclosure provides a hinge structure including a rotating shaft, a driving assembly and a connecting assembly, and the driving assembly may drive the connecting assembly to move away from or close to the rotating shaft in a hydraulic manner and/or a pneumatic manner under the drive of the rotating shaft, when the rotating shaft rotates, such that the connecting assembly may control a flexible display panel when the rotating shaft rotates. In addition, the hinge structure drives the connecting assembly in the hydraulic manner and/or the pneumatic manner without being connected to an external control circuit, thereby occupying less space, which solves the problems of a complex structure and a large space occupation of an electric driving assembly and the external control circuit in the related art, and achieves the effect of reducing the space occupied by the hinge structure.

In addition, the driving assembly may provide a damping effect during the rotation of the rotating shaft. On one hand, the experience of a user can be improved while the user rotates the rotating shaft. On the other hand, there is no need to provide an additional damping structure in the hinge structure, which further simplifies the hinge structure and reduces the space occupied by the hinge structure.

As illustrated in FIG. 1, for example, the hinge structure 21 includes two hinge components 21a, and each hinge component 21a includes a rotating shaft 211, a driving assembly 212 and a connecting assembly 213. A schematic view of one hinge component 21a is shown in a dashed-line box of FIG. 1. The driving assembly 212 includes a pressure chamber 2a and a driving member 2b, the pressure chamber 2a contains a medium, which is a gas and/or a liquid. The medium is a working medium for transmitting power and signals in the driving assembly 212, and may be various mixed gases, a high water-based flame resistant hydraulic fluid, a water glycol hydraulic fluid, a phosphate ester hydraulic fluid, a fatty acid ester hydraulic fluid, an anti-wear hydraulic fluid, a petroleum hydraulic oil, a synthetic hydraulic oil and a non-flammable hydraulic oil, which is not limited in the examples of the present disclosure. Of course, the hinge structure 21 may also include more hinge components 21a, such as three, four, etc., which is not limited in the examples of the present disclosure.

The driving member 2b is movably inserted into one end of the pressure chamber 2a and linked with the rotating shaft 211, and the connecting assembly 213 is movably inserted into the other end of the pressure chamber 2a. The driving member 2b is configured to extend and retract in the pressure chamber 2a under the drive of the rotating shaft 211, and drives the connecting assembly 213 to move away from or close to the rotating shaft 211 in the pressure chamber 2a through the medium. In this way, the driving member 2b can extend and retract to drive the connecting assembly 213 to move, thereby facilitating a folding control of the flexible display panel.

For example, the pressure chamber 2a includes a first pressure chamber 2a1 and a second pressure chamber 2a2 interconnected (i.e. communicated or in communication) with each other, the driving member 2b is movably inserted into one end of the first pressure chamber 2a1, and the connecting assembly 213 is movably inserted into one end of the second pressure chamber 2a2. Further, the other end of the first pressure chamber 2a1 is interconnected (i.e. communicated or in communication) with the other end of the second pressure chamber 2a2.

The first pressure chamber 2a1 is located in the rotating shaft 211, and the driving assembly 212 further includes a limit member 2e located at the first pressure chamber 2a1. The limit member 2e is connected to the driving member 2b such that the driving member 2b rotates synchronously with the rotating shaft 211. Since the limit member 2e is connected to the driving member 2b, when the driving member 2b rotates synchronously with the rotating shaft 211, the driving member 2b can only extend and retract along an axial direction of the rotating shaft 211 without rotating relative to the rotating shaft 211.

In an illustrative example, the first pressure chamber 2a1 may also be located outside the rotating shaft 211, which is not limited in the examples of the present disclosure.

In addition, the above limit member 2e is a means to link the driving member 2b with the rotating shaft 211, while the driving member 2b and the rotating shaft 211 may also be linked by other means. For example, the hinge structure may also include a linkage gear, and the driving member 2b and the rotating shaft 211 are linked through the linkage gear, which is not limited in the examples of the present disclosure.

Figure 2:
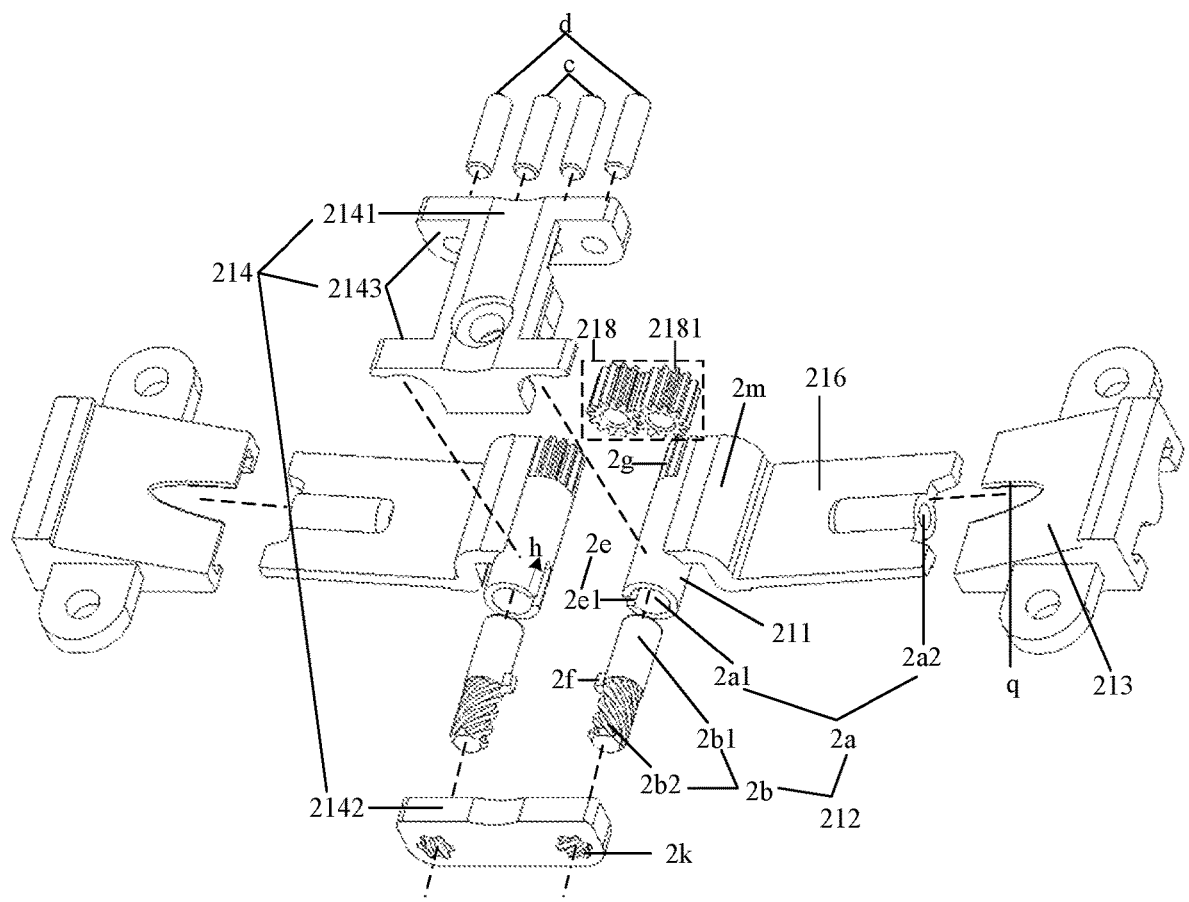
FIG. 2 is an exploded view of the hinge structure shown in FIG. 1.

As illustrated in FIG. 2, FIG. 2 is an exploded view of the hinge structure shown in FIG. 1. In an illustrative example, the hinge structure 21 further includes a bracket 214, and the driving member 2b includes a piston portion 2b1 and a first connecting portion 2b2, and the piston portion 2b1 is movably inserted into the one end of the first pressure chamber 2a1. In this way, the piston portion 2b1 may perform a piston movement in the first pressure chamber 2a1 to push the medium in the first pressure chamber 2a1 into the second pressure chamber 2a2, or suck the medium in the second pressure chamber 2a2 into the first pressure chamber 2a1.

The first connecting portion 2b2 is located at an end of the driving member 2b away from the first pressure chamber 2a1 and is threadedly connected with the bracket 214. The first connecting portion 2b2 may have an external thread, that is, the first connecting portion 2b2 may be a screw rod, so as to be threadedly connected with the bracket 214. For example, the driving member 2b may have a rod shape. Accordingly, the piston portion 2b1 may be a piston rod, and the piston rod and the screw rod serving as the first connecting portion 2b2 are integral.

For example, the bracket 214 includes a bracket body 2141, an abutting portion 2142 and a rotating-shaft mounting portion 2143. The abutting portion 2142 abuts against the bracket body 2141 and the rotating-shaft mounting portion 2143. A side wall of the abutting portion 2142, a side wall of the bracket body 2141 and a side wall of the rotating-shaft mounting portion 2143 are define an accommodation space, and a part of the rotating shaft 211 is located in the accommodation space. The bracket body 2141 and the rotating-shaft mounting portion 2143 may be integral, and the abutting portion 2142 may be welded with the rotating-shaft mounting portion 2143. An end of the rotating shaft 211 is inserted onto the rotating-shaft mounting portion 2143.

The abutting portion 2142 has a screw hole 2k, and the first connecting portion 2b2 is threadedly connected in the screw hole 2k. Since the piston portion 2b1 connected to the first connecting portion 2b2 is movably inserted into the one end of the first pressure chamber 2a1 inside the rotating shaft 211, the rotating shaft 211 can be limited by the first connecting portion 2b2 and the end of the rotating shaft 211 that is inserted into the rotating-shaft mounting portion 2143, so as to prevent the rotating shaft from being separated from the bracket 214. In this way, when the rotating shaft 211 rotates, the driving member 2b moves away from the first pressure chamber 2a1 or close to the first pressure chamber 2a1 under an action of the screw hole 2k, that is, the driving member 2b may extend and retract in the first pressure chamber 2a1, so as to push the medium out of the first pressure chamber 2a1 or suck the medium into the first pressure chamber 2a1.

For example, the limit member 2e includes a limit slot 2e1 formed in an inner wall of the first pressure chamber 2a1, and a length direction h of the limit slot 2e1 is parallel to a length direction of the driving member 2b. The limit slot 2e1 may have a strip shape.

The driving assembly 212 further includes a limit member 2f connected to an outer wall of the driving member 2b and located in the limit slot 2e1. Alternatively, the limit member 2f and the driving member 2b may be integral to improve the firmness between the limit member 2f and the driving member 2b.

The limit member 2e may be the limit slot 2e1, and the length direction of the limit slot 2e1 may be parallel to the length direction of the driving member 2b. In this way, the limit slot 2e1 may be fitted with the limit member 2f to limit a moving direction of the driving member 2b, such that the driving member 2b can only extend and retract in the length direction of the driving member 2b relative to the first pressure chamber 2a1.

Figure 3:
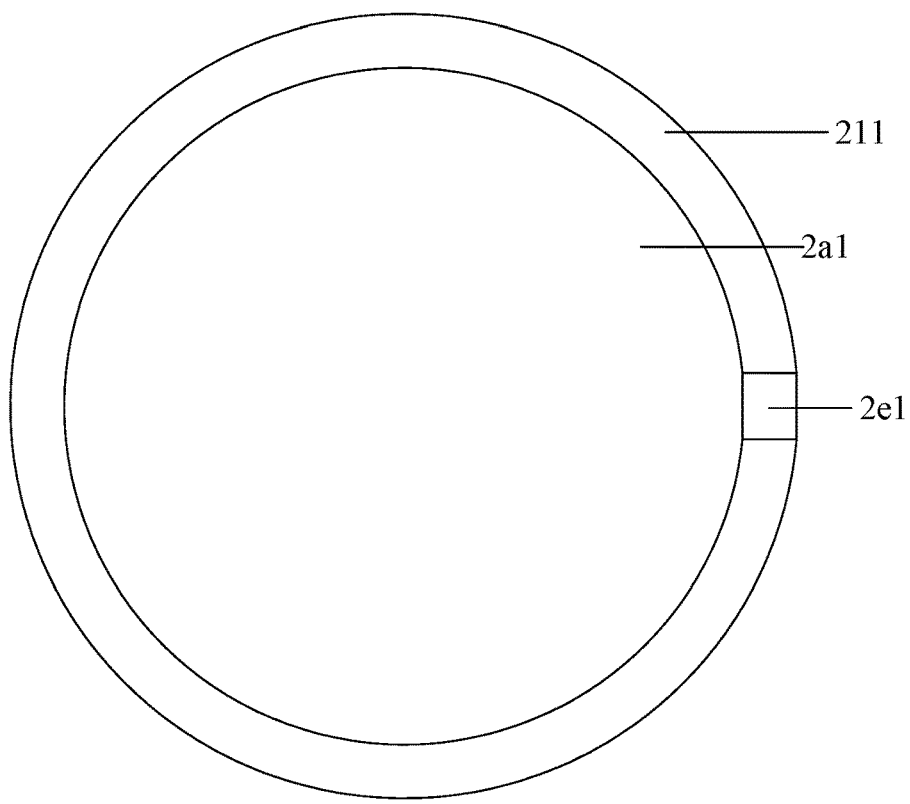
FIG. 3 is a schematic view of a rotating shaft according to one or more examples of the present disclosure.

In the examples of the present disclosure, the limit slot may have at least two kinds of structures. One kind of structure may be illustrated in FIG. 3, and FIG. 3 is a schematic view of the rotating shaft 211 shown in FIG. 1 viewed along a direction f (i.e. the axial direction). The limit slot 2e1 may be a through slot running through a chamber wall (which includes the inner side wall and also an outer side wall) of the first pressure chamber 2a1, and the limit member 2f on the driving member 2b may be located in the through slot to limit the driving member 2b. Due to its large depth, the limit slot 2e1 with this kind of structure runs through the chamber wall of the first pressure chamber 2a1, such that the stability is relatively high. Thus, a small number (such as 1-3) of the limit slots may be provided to stably limit the driving member 2b.

Figure 4:
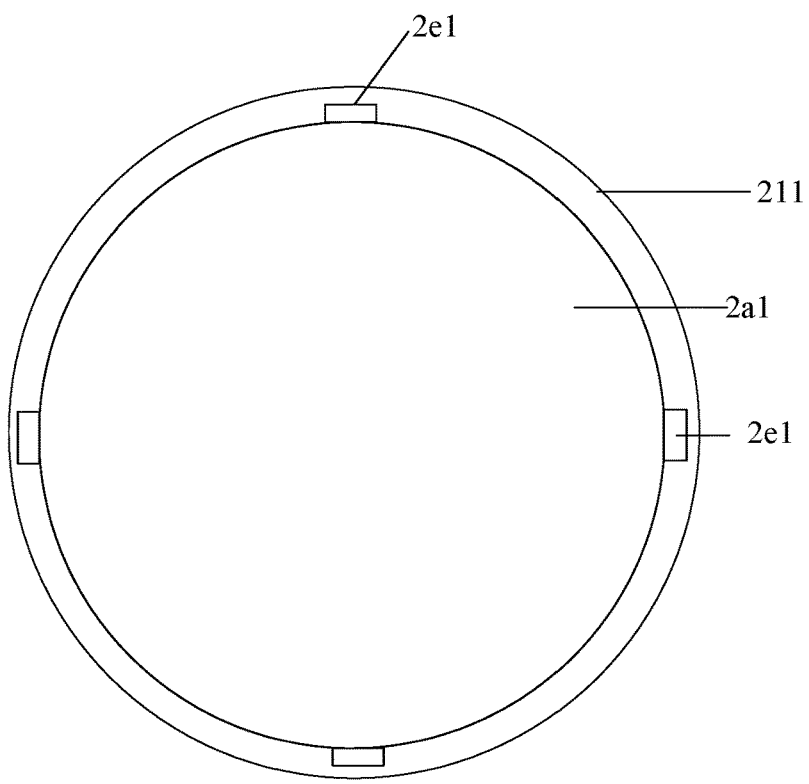
FIG. 4 is a schematic view of a rotating shaft according to one or more examples of the present disclosure.

Another kind of structure may be illustrated in FIG. 4, and FIG. 4 is another schematic view of the rotating shaft in the hinge structure provided by the example of the present disclosure, viewed along the axial direction. The limit slot 2e1 may also be a groove in the inner wall of the first pressure chamber 2a1. In the hinge structure provided by the example of the present disclosure, the limit slot in the rotating shaft of the two hinge components may be any one of the above two structures.

The limit member may include at least two limit slots 2e1 (FIG. 4 shows a case that there are four grooves serving as the limit slots, however, there may be other numbers of limit slots, such as 2, 3, 5, 6, 8, etc., which is not limited in the examples of the present disclosure). The driving assembly 212 further includes at least two limit elements in one-to-one correspondence with the at least two limit slots 2e1. When the limit member is the groove in the inner wall of the first pressure chamber 2a1, the stability is reduced relative to the through slot. Therefore, at least two limit slots 2e1 and at least two limit elements in one-to-one correspondence with the at least two limit slots 2e1 may be adopted to strengthen the stability. Moreover, when the limit member is the through slot in the inner wall of the first pressure chamber 2a1, at least two limit slots 2e1 and at least two limit elements in one-to-one correspondence with the at least two limit slots 2e1 may also be adopted to strengthen the limit effect, which is not limited in the examples of the present disclosure.

For example, as illustrated in FIG. 1, the hinge structure 21 further includes a connecting pipe 215 having an end interconnected (i.e. communicated or in communication) with the first pressure chamber 2a1 and another end interconnected (i.e. communicated or in communication) with the second pressure chamber 2a2. The connecting pipe 215 may communicate the first pressure chamber 2a1 with the second pressure chamber 2a2, and the medium may enter the first pressure chamber 2a1 or the second pressure chamber 2a2 through the connecting pipe 215.

For example, the hinge component further includes a second connecting portion 216 connected to the rotating shaft 211, the second pressure chamber 2a2 is arranged to the second connecting portion 216, and the connecting pipe 215 is located in the second connecting portion 216. The second connecting portion 216 is connected to the rotating shaft 211 and may rotate along with the rotating shaft 211. The connecting pipe 215 is arranged in the second connecting portion 216 to provide a flow channel for the medium to flow between the first pressure chamber 2a1 and the second pressure chamber 2a2 when the rotating shaft 211 rotates, without affecting a normal operation of the hinge structure. For example, the second connecting portion 216 may have a plate shape.

FIG. 1 shows a structure in which the connecting pipe 215 is located in the second connecting portion 216. However, the connecting pipe 215 may also be arranged in other ways. For example, the connecting pipe 215 may be a pipeline located outside the second connecting portion 216, for the communication between the first pressure chamber 2a1 and the second pressure chamber 2a2. This arrangement has effects of low difficulty in arrangement and easy replacement of hydraulic pipes.

In another illustrative example, the second connecting portion 216 may have a bent relief section 2m bent towards a side of the hinge structure (a bending direction may be perpendicular to an axis of the rotating shaft), the bent relief section 2m may be configured to escape other external structures located on the side of the hinge structure, such as a housing (not shown in FIG. 1), and the housing may cover the side of the hinge structure, so as to protect an internal configuration of the hinge structure.

Figure 5:
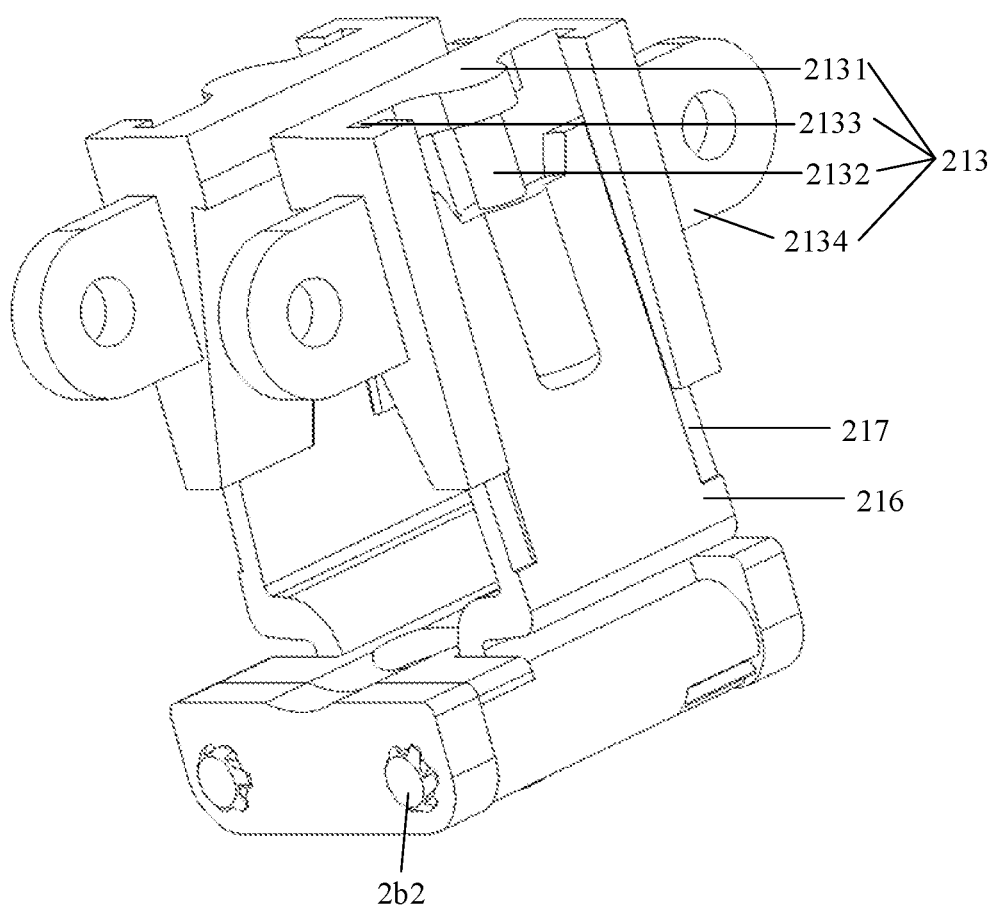
FIG. 5 is a schematic view of a hinge structure in a folded state according to one or more examples of the present disclosure.
Figure 6:
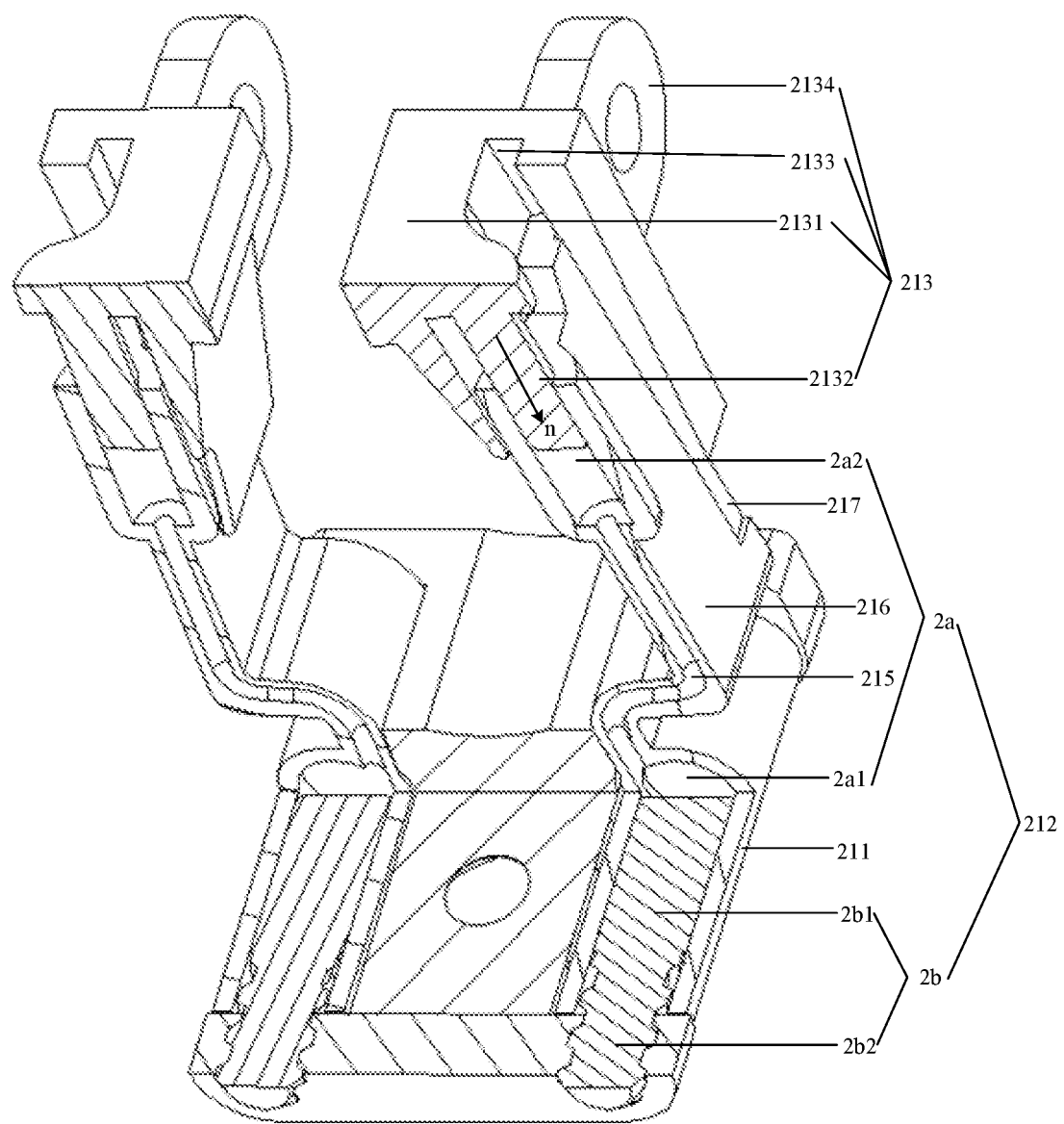
FIG. 6 is a sectional view of the hinge structure shown in FIG. 5.

FIG. 5 is a schematic view of a hinge structure in a folded state according to an illustrative example of the present disclosure. FIG. 6 is a sectional view of the hinge structure shown in FIG. 5. As illustrated in FIG. 5 and FIG. 6, the connecting assembly 213 includes a connecting member 2131, a piston rod 2132 and a sliding member 2133. Both the piston rod 2132 and the sliding member 2133 are arranged on the connecting member 2131, and the piston rod 2132 is movably inserted into the one end of the second pressure chamber 2a2.

The hinge structure 21 further includes a sliding rail 217 located on the second connecting portion 216, a direction of the sliding rail 217 is parallel to a length direction n of the piston rod 2132, and the sliding member 2133 of the connecting assembly 213 is slidably connected to the sliding rail 217. The sliding rail 217 may be configured to assist the piston rod 2132 in limiting a moving direction of the connecting member 2131, such that the moving direction of the connecting member 2131 is the same with that of the piston rod 2132.

As can be seen in FIG. 5 and FIG. 6, the medium contained in the first pressure chamber 2a1 is pushed into the connecting pipe 215 by the driving member 2b, and the medium flows into the second pressure chamber 2a2 via the connecting pipe 215, and pushes the piston rod 2132 to move in the second pressure chamber 2a2, so as to achieve the sliding of the connecting portion 2131 on the sliding rail 217. Thus, the hinge structure can lift the flexible display panel when the flexible display panel is folded, so as to prevent a bent portion of the flexible display panel from be squeezed.

For example, as illustrated in FIG. 2, the connecting assembly 213 further includes a relief notch q formed in the connecting member 2131, and the relief notch q matches with an outer wall of the second pressure chamber 2a2 to escape the second pressure chamber 2a2. When the connecting assembly 213 moves close to the rotating shaft 211, the outer wall of the second pressure chamber 2a2 may enter the relief notch q to prevent the outer wall of the second pressure chamber 2a2 from blocking the connecting assembly 213.

As shown in FIG. 5, the connecting assembly further includes a connecting terminal 2134 arranged on the connecting member 2131 for fixing the flexible display panel (for example, the connecting terminal 2134 may be configured to be connected with a middle frame of the flexible display panel). For example, the connecting terminal 2134 may have a ring shape to facilitate a bolted connection.

Figure 7:
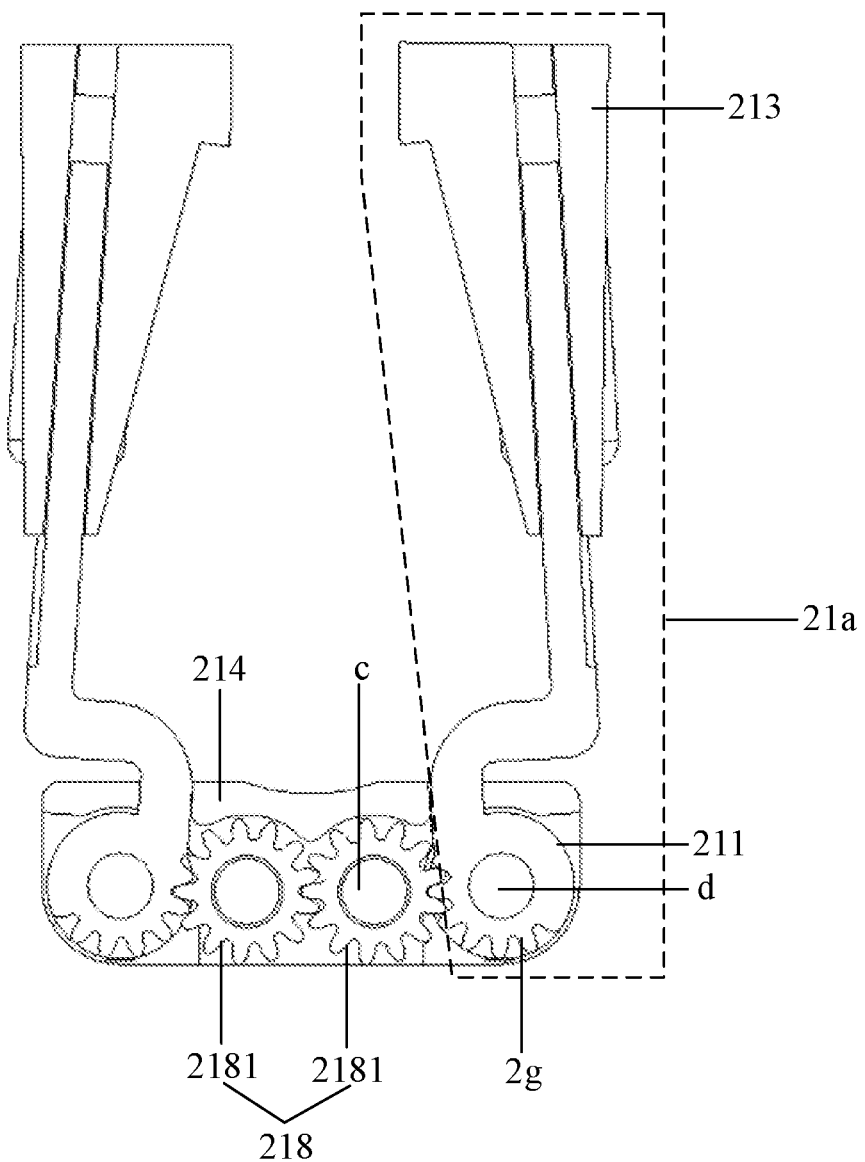
FIG. 7 is a schematic view of a hinge structure in a folded state according to one or more examples of the present disclosure.
Figure 8:
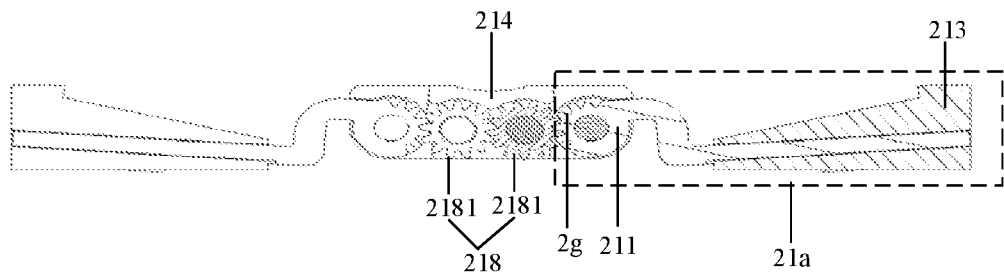
FIG. 8 is a schematic view of a hinge structure in an unfolded state according to one or more examples of the present disclosure.

FIG. 7 is a schematic view of a hinge structure in a folded state according to an illustrative example of the present disclosure, viewed along the axis direction of the rotating shaft 211. FIG. 8 is a sectional view of a hinge structure in an unfolded state according to an illustrative example of the present disclosure. The folded state may refer to a state of the hinge structure 21 when an included angle between the two second connecting portions 216 in the hinge structure 21 is less than a specified number of degrees (such as 60 degrees). The unfolded state refers to a state of the hinge structure when the included angle between the two second connecting portions 216 in the hinge structure of a foldable display device is greater than or equal to a specified number of degrees. Of course, the unfolded state further includes a fully unfolded state, which may refer to a state of the hinge structure when the flexible display panel connected to the hinge structure is in a flat state.

In an illustrative example, both the two hinge components 21a in the hinge structure 21 may be driven by the above driving assembly 212. When both the two hinge components are driven by the driving assembly 212, a damping structure, a control circuit and an electric driving structure do not need to be provided additionally for the two hinge components, thus simplifying the structure and saving the space.

It should be noted that in the hinge structure provided by the examples of the present disclosure, one of the two hinge components 21 may be driven by the driving assembly, and the other hinge component may be driven by other means, for example, driven by the electric driving structure, which is not limited in the examples of the present disclosure.

For example, the hinge structure 21 further includes a synchronization assembly 218 fitted with the rotating shafts 211 of the two hinge components 21a respectively, such that the rotating shafts 211 of the two hinge components 21a may rotate synchronously and reversely. For example, one rotating shaft rotates counterclockwise and the other rotating shaft rotates clockwise.

The synchronization assembly 218 may maintain the rotating shafts 211 of the two hinge components 21a of the hinge structure 21 rotating synchronously and reversely, so as to achieve the folding or unfolding of the flexible display panel. Thus, rotation amplitudes of two sides of the flexible display panel rotating along the rotating shafts may be consistent during the folding and unfolding of the flexible display panel.

Figure 9:
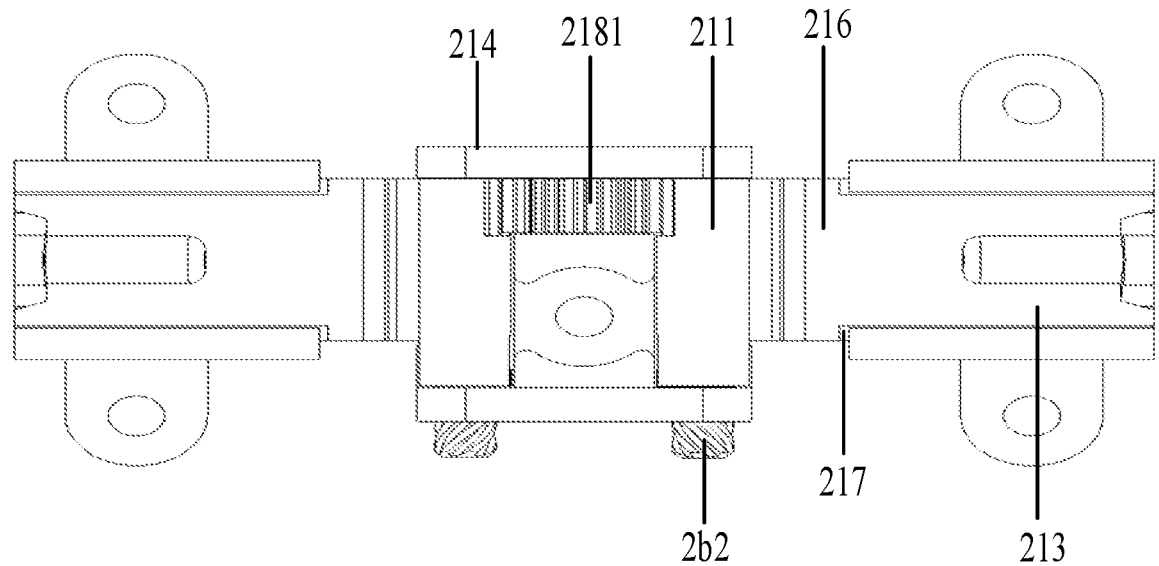
FIG. 9 is a bottom view of the hinge structure shown in FIG. 8.

FIG. 9 is a bottom view of the hinge structure shown in FIG. 8. As illustrated in FIGS. 7-9, gear teeth 2g are provided on an outer side the rotating shaft 211. The synchronization assembly 218 includes two gears 2181, shafts c of the two gears 2181 and spindles d of the rotating shafts 211 of the two hinge components 21a are arranged on the bracket 214. The shaft c of the gear 2181 and the spindle d of the rotating shaft 211 may have an effect of fixing the gear 2181 and the rotating shaft 211, the two gears 2181 are meshed with each other, and the two gears 2181 are meshed with the gear teeth 2g on the rotating shafts 211 of the two hinge components 21a, respectively. In this way, when the second connecting portion 216 in one hinge component 21a drives the rotating shaft 211 to rotate, the gear teeth 2g on the rotating shaft 211 may sequentially drive the two gears 2181 in the synchronization assembly 218 to rotate. According to characteristics of gear transmission, in the two gears 2181, a rotation direction of the gear 2181 meshed with the gear teeth 2g on the rotating shaft 211 is opposite to that of the rotating shaft 211, and a rotation direction of the other gear 2181 is the same with that of the rotating shaft 211. Thus, a rotation direction of the rotating shaft in the other hinge component 21a meshed with the other gear 2181 is opposite to that of the rotating shaft 211. In this way, a function of synchronous and reverse rotation of the two hinge components 21a is achieved. The structure of the synchronization assembly 218 may also refer to the content shown in FIG. 2.

The example of the present disclosure provides a structure in which the synchronization assembly 218 includes two gears. The synchronization assembly adopts a gear transmission means, such that the transmission accuracy is high, and a working structure of the hinge structure is reliable and has a long service life.

The flexible display panel may be folded in two manners, namely folded inwardly and folded outwardly, in which a display surface of the flexible display panel for displaying images may be divided into two sub display surfaces by a folded portion (i.e. the bent portion). When the flexible display panel is folded inwardly, the two sub display surfaces are located on an inner side of the flexible display panel, and when the flexible display panel is folded outwardly, the two sub display surfaces of the flexible display panel are located on an outer side of the flexible display panel. The hinge structure provided by the illustrative example may be applied to these two folding manners.

When the flexible display panel is folded inwardly, and the two hinge components 21a are in the folded state, the flexible display panel is located on an inner side of the hinge structure 21 and the connecting assembly 213 is in an extended state. In this way, the flexible display panel may be pushed away by the connecting assembly 213 in the folded state, such that the folded portion of the flexible display panel is away from the hinge structure, thereby preventing the hinge structure and the flexible display panel from squeezing each other, so as not to damage the flexible display panel.

When the flexible display panel is folded outwardly, and the two hinge components 21a are in the folded state, the flexible display panel is located on outer side of the hinge structure 21 and the connecting assembly 213 is in a retracted state. In this way, the flexible display panel may be pushed away by the connecting assembly 213 in the folded state, such that the folded portion of the flexible display panel is away from the hinge structure, thereby prevent the hinge structure and the flexible display panel from squeezing each other, so as not to damage the flexible display panel. In addition, when the two hinge components 21*a* are in the unfolded state, the piston rod 2132 is in the extended state, such that in the unfolded state, the folded portion of the flexible display panel may be stretched by the connecting assembly 213, so as to reduce creases at the folded portion.

That is, when the flexible display panel is folded inwardly or outwardly, the hinge structure provided by the illustrative example can prevent the folded portion of the flexible display panel from being squeezed, and when the flexible display panel is unfolded to be flat, the hinge structure provided by the illustrative example can also reduce the creases at the folded portion by stretching the flexible display panel.

To sum up, an illustrative example of the present disclosure provides a hinge structure including a rotating shaft, a driving assembly and a connecting assembly, and the driving assembly may drive the connecting assembly to move away from or close to the rotating shaft in a hydraulic and/or pneumatic manner when the rotating shaft rotates, such that the connecting assembly may control the flexible display panel when the rotating shaft rotates. In addition, the hinge structure drives the connecting assembly in the hydraulic manner and/or the pneumatic manner without being connected to an external control circuit, thereby occupying less space, which solves the problems of a complex structure and a large space occupation of an electric driving assembly and the external control circuit in the related art, and achieves the effect of reducing the space occupied by the hinge structure.

In addition, the driving assembly may provide a damping effect during the rotation of the rotating shaft. On one hand, the experience of a user may be improved while the user rotates the rotating shaft. On the other hand, there is no need to provide an additional damping structure in the hinge structure, which further simplifies the hinge structure and reduces the space occupied by the hinge structure.

Furthermore, the examples of the present disclosure also provide a foldable display device. The foldable display device includes a flexible display panel and any one of the above hinge structures, and the flexible display panel is arranged on the hinge structure. The hinge structure may be arranged at a folded portion of the flexible display panel.

The foldable display device may include one or more hinge structures provided by the above examples, for example, two, three, four or more hinge structures may be provided, which is not limited in the examples of the present disclosure. For example, the larger the size of the flexible display panel, the more the number of hinge structures may be.

In addition, the flexible display panel may be an organic light emitting diode display panel or another display panel having flexibility.

The foldable display device may be a mobile phone, a tablet computer, a desktop computer, a notebook computer, an intelligent wearable device, etc.

The foldable display device may also include other components for realizing various functions, such as a processor, a memory, a device interface, a RF circuit, a camera component, an audio circuit, a positioning component, a power supply, one or more sensors (such as an acceleration sensor, a gyroscope sensor, a pressure sensor, a fingerprint sensor, an optical sensor, a proximity sensor, etc.).

Figure 10:
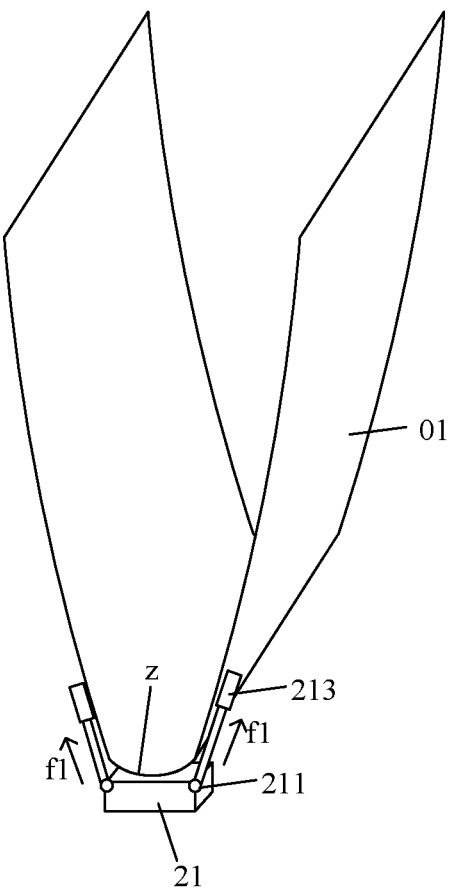
FIG. 10 is a schematic view of a foldable display device according to one or more examples of the present disclosure.

FIG. 10 is a schematic view of a foldable display device in a folded state provided by an example of the present disclosure, in which the foldable display device is a foldable display device configured to be folded inwardly. As illustrated in FIG. 10, the hinge structure 21 is located on an outer side of a flexible display panel 01, and the connecting assembly 213 in the hinge structure 21 is connected to the flexible display panel 01 (of course, the connecting assembly 213 may also be indirectly connected to the flexible display panel 01 through other structures, for example, the flexible display panel 01 may be arranged on a frame, and the connecting assembly 213 may be connected to the frame). While the foldable display device is switched from an unfolded state to the folded state, the connecting assembly 213 may move away from the rotating shaft 211 in a direction f1 such that a folded portion z of the flexible display panel 01 is away from the hinge structure 21, thereby preventing the flexible display panel 01 and the hinge structure from squeezing each other, and improving the protection effect for the flexible display panel 01 and the hinge structure 21.

Figure 11:
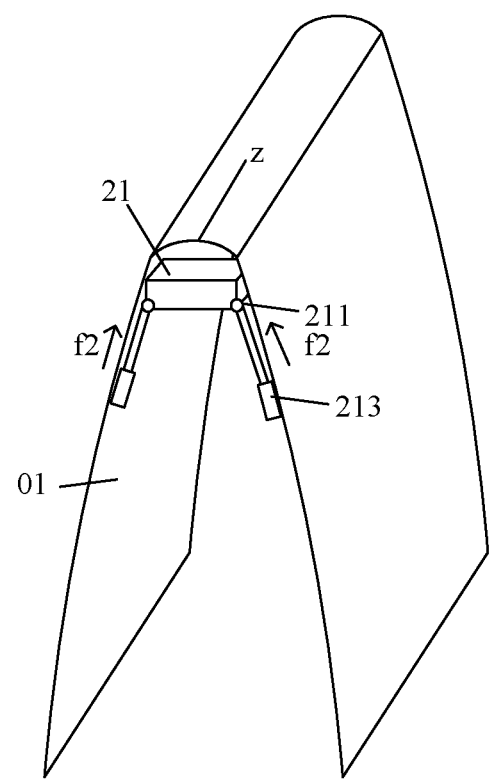
FIG. 11 is a schematic view of a foldable display device according to one or more examples of the present disclosure.

In addition, FIG. 11 is a schematic view of a foldable display device in a folded state provided by an example of the present disclosure, in which the foldable display device is a foldable display device configured to be folded outwardly. As illustrated in FIG. 11, the hinge structure 21 is located on an inner side of the flexible display panel 01, and the connecting assembly 213 in the hinge structure 21 is connected to the flexible display panel 01 (of course, the connecting assembly 213 may also be indirectly connected to the flexible display panel 01 through other structures, for example, the flexible display panel 01 may be arranged on the frame (such as a middle frame), and the connecting assembly 213 may be connected to the frame). While the foldable display device is switched from the unfolded state to the folded state, the connecting assembly 213 may move close to the rotating shaft 211 in a direction f2 such that the folded portion z of the flexible display panel 01 is away from the hinge structure 21, thereby preventing the flexible display panel 01 and the hinge structure from squeezing each other, and improving the protection effect for the flexible display panel 01 and the hinge structure 21.

Figure 12:
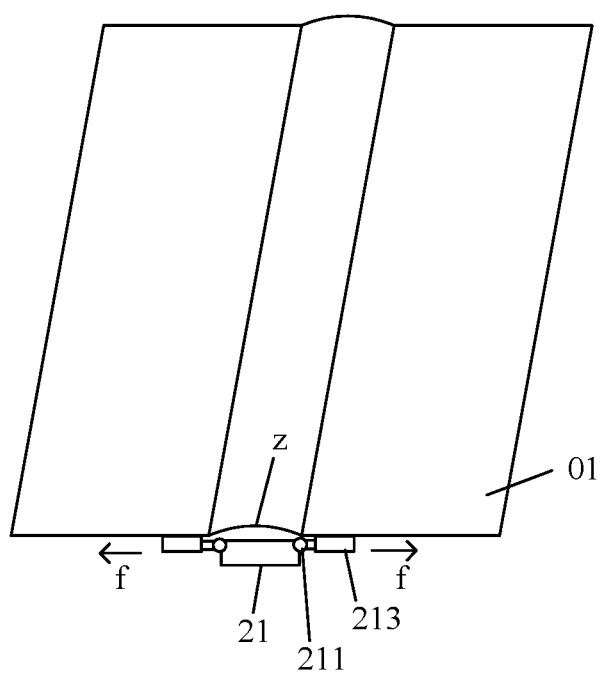
FIG. 12 is a schematic view of a foldable display device according to one or more examples of the present disclosure.

In addition, FIG. 12 is a schematic view of a foldable display device in an unfolded state provided by an example of the present disclosure, in which the foldable display device is a foldable display device configured to be folded outwardly. As illustrated in FIG. 12, while the foldable display device is switched from the folded state to the unfolded state, the connecting assembly 213 may move away from the rotating shaft 211 in a direction f to stretch the folded portion z of the flexible display panel 01, so as to reduce or eliminate creases at the folded portion z, and improve the display effect of the flexible display panel.

It should be noted that in order to clearly show the hinge structure 21 in FIG. 10 to FIG. 12, the hinge structure 21 is arranged at an edge of the flexible display panel 01. However, these drawings do not limit the position of the hinge structure 21. The folded portion of the flexible display panel may be a strip area, and the hinge structure 21 may also be connected to other parts of the strip area.

To sum up, an illustrative example of the present disclosure provides a display device including a flexible display panel and a hinge structure, the flexible display panel is arranged on the hinge structure, and the hinge structure includes a rotating shaft, a driving assembly and a connecting assembly. The driving assembly may drive the connecting assembly to move away from or close to the rotating shaft in a hydraulic manner and/or a pneumatic manner under the drive of the rotating shaft, when the rotating shaft rotates, such that the connecting assembly may control the flexible display panel when the rotating shaft rotates. In addition, the hinge structure drives the connecting assembly in the hydraulic manner and/or the pneumatic manner without being connected to an external control circuit, thereby occupying less space, which solves the problems of a complex structure and a large space occupation of an electric driving assembly and the external control circuit in the related art, and achieves the effect of reducing the space occupied by the hinge structure.

In addition, the driving assembly may provide a damping effect during the rotation of the rotating shaft. On one hand, the experience of a user may be improved while the user rotates the rotating shaft. On the other hand, there is no need to provide an additional damping structure in the hinge structure, which further simplifies the hinge structure and reduces the space occupied by the hinge structure.

Terms used in the present disclosure are merely for describing specific examples and are not intended to limit the present disclosure. The singular forms "one", "the", and "this" used in the present disclosure and the appended claims are also intended to include a multiple form, unless other meanings are clearly represented in the context. The term "and/or" in the present disclosure only represent an association relationship describing the associated objects, which means that there may be three relationships. For example, A and/or B may mean that there are three situations: A alone, A and B, and B alone. In addition, the character "/" herein generally means that the front and rear associated objects are in an "or" relationship.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

In the present disclosure, terms such as "first" and "second" are used herein for purposes of description and are not intended to indicate or imply relative importance. Term "a plurality of" means two or more than two, unless specified otherwise.

The above descriptions are only optional examples of the present disclosure, which are not intended to limit the present disclosure. Any modification, equivalent replacement, improvement, etc. made within the spirit and principle of the present disclosure should be included in the protection scope of the present disclosure.

What is claimed is:

1. A hinge structure, comprising:
a rotating shaft and a connecting assembly;
a driving assembly connected to the connecting assembly and the rotating shaft, wherein the driving assembly is configured to drive the connecting assembly to move relatively to the rotating shaft in at least one of a hydraulic manner or a pneumatic manner under drive of the rotating shaft when the rotating shaft rotates;
a pressure chamber comprising a medium, the medium being at least one of a gas or a liquid; and
a driving member movably inserted into a first end of the pressure chamber and linked with the rotating shaft,
wherein the connecting assembly is movably inserted into a second end of the pressure chamber, the driving member is configured to extend and retract in the pressure chamber under the drive of the rotating shaft, and the driving member is configured to drive the connecting assembly to move relatively to the rotating shaft in the pressure chamber through the medium.

2. The hinge structure according to claim 1, wherein the pressure chamber comprises a first pressure chamber and a second pressure chamber interconnected with each other, the driving member is movably inserted into a first end of the first pressure chamber, the connecting assembly is movably inserted into a first end of the second pressure chamber, and a second end of the first pressure chamber is interconnected with a second end of the second pressure chamber,
the first pressure chamber is arranged in the rotating shaft, the driving assembly further comprises a limit member arranged at the first pressure chamber, and the limit member is connected to the driving member to allow the driving member to rotate synchronously with the rotating shaft.

3. The hinge structure according to claim 2, further comprising a bracket, wherein the driving member comprises a piston portion and a first connecting portion, and the piston portion is movably inserted into the first end of the first pressure chamber,
the first connecting portion is arranged at an end of the driving member away from the first pressure chamber and is threadedly connected with the bracket.

4. The hinge structure according to claim 3, wherein the bracket comprises a bracket body, an abutting portion and a rotating-shaft mounting portion, the abutting portion abuts against the bracket body and the rotating-shaft mounting portion, a side wall of the abutting portion, a side wall of the bracket body and a side wall of the rotating-shaft mounting portion define an accommodation space, a part of the rotating shaft is arranged in the accommodation space, an end of the rotating shaft is inserted onto the rotating-shaft mounting portion, the abutting portion comprises a screw hole, and the first connecting portion is threadedly connected in the screw hole.

5. The hinge structure according to claim 2, wherein the limit member comprises a limit slot formed in an inner wall of the first pressure chamber, and a length direction of the limit slot is parallel to a length direction of the driving member,
the driving assembly further comprises a limit member connected to an outer wall of the driving member and arranged in the limit slot.

6. The hinge structure according to claim 5, wherein the limit slot is a through slot running through a chamber wall of the first pressure chamber.

7. The hinge structure according to claim 5, wherein the limit slot is a groove in the inner wall of the first pressure chamber.

8. The hinge structure according to claim 2, further comprising a connecting pipe having an end interconnected with the first pressure chamber and another end interconnected with the second pressure chamber.

9. The hinge structure according to claim 8, further comprising a second connecting portion connected to the rotating shaft, wherein the second pressure chamber is arranged to the second connecting portion, and the connecting pipe is arranged in the second connecting portion.

10. The hinge structure according to claim 9, wherein the connecting assembly comprises a connecting member, a piston rod and a sliding member, both the piston rod and the sliding member are arranged on the connecting member, and the piston rod is movably inserted into the first end of the second pressure chamber,
the hinge structure further comprises a sliding rail arranged on the second connecting portion, a direction of the sliding rail is parallel to a length direction of the piston rod, and the sliding member of the connecting assembly is slidably connected to the sliding rail.

11. The hinge structure according to claim 10, wherein the connecting assembly further comprises a relief notch formed in the connecting member, and the relief notch matches with an outer wall of the second pressure chamber and is configured to escape the second pressure chamber.

12. The hinge structure according to claim 1, further comprising a synchronization assembly, wherein the hinge structure comprises two hinge components, and each hinge component comprises the rotating shaft, the driving assembly and the connecting assembly, the synchronization assembly is fitted with rotating shafts of the two hinge components, respectively, to allow the rotating shafts of the two hinge components to rotate synchronously and reversely.

13. The hinge structure according to claim 12, wherein gear teeth are arranged on an outer side of the rotating shaft, the synchronization assembly comprises two gears meshed with each other, and the two gears are meshed with the gear teeth on the rotating shafts of the two hinge components, respectively.

14. The hinge structure according to claim 1, wherein the driving assembly is configured to drive the connecting assembly to move away from the rotating shaft under the drive of the rotating shaft when the rotating shaft rotates in a first direction, and the driving assembly is configured further to drive the connecting assembly to move close to the rotating shaft under the drive of the rotating shaft when the rotating shaft rotates in a second direction, and the second direction is opposite to the first direction.

15. The hinge structure according to claim 1, wherein the driving member is configured to extend in the pressure chamber under the drive of the rotating shaft, and the driving member is configured to drive the connecting assembly to move away from the rotating shaft in the pressure chamber through the medium, the driving member is further configured to retract in the pressure chamber under the drive of the rotating shaft, and to drive the connecting assembly to move close to the rotating shaft in the pressure chamber through the medium.

16. A foldable display device, comprising:
a hinge structure; and
a flexible display panel arranged on the hinge structure, wherein the hinge structure comprises:
a rotating shaft and a connecting assembly; and
a driving assembly connected to the connecting assembly and the rotating shaft, wherein the driving assembly is configured to drive the connecting assembly to move relatively to the rotating shaft in at least one of a hydraulic manner or a pneumatic manner under drive of the rotating shaft when the rotating shaft rotates,
wherein the driving assembly comprises:
a pressure chamber comprising a medium, the medium being at least one of a gas or a liquid; and
a driving member movably inserted into a first end of the pressure chamber and linked with the rotating shaft,
wherein the connecting assembly is movably inserted into a second end of the pressure chamber, the driving member is configured to extend and retract in the pressure chamber under the drive of the rotating shaft, and the driving member is configured to drive the connecting assembly to move relatively to the rotating shaft in the pressure chamber through the medium.

17. The foldable display device according to claim 16, wherein the pressure chamber comprises a first pressure chamber and a second pressure chamber interconnected with each other, the driving member is movably inserted into a first end of the first pressure chamber, the connecting assembly is movably inserted into a first end of the second pressure chamber, and a second end of the first pressure chamber is interconnected with a second end of the second pressure chamber, the first pressure chamber is arranged in the rotating shaft, the driving assembly further comprises a limit member arranged at the first pressure chamber, and the limit member is connected to the driving member to allow the driving member to rotate synchronously with the rotating shaft.

18. The foldable display device according to claim 17, wherein the hinge structure further comprises a bracket, the driving member comprises a piston portion and a first connecting portion, and the piston portion is movably inserted into the first end of the first pressure chamber, the first connecting portion is arranged at an end of the driving member away from the first pressure chamber and is threadedly connected with the bracket.

* * * * *